United States Patent [19]
Taylor et al.

[11] Patent Number: 5,986,208
[45] Date of Patent: Nov. 16, 1999

[54] WAVEGUIDE WINDOW ASSEMBLY AND MICROWAVE ELECTRONICS PACKAGE

[75] Inventors: Edward A. Taylor, East Wenatchee; Marshall Neal Hulbert, Wenatchee, both of Wash.

[73] Assignee: Pacific Coast Technologies, Inc., Wenatchee, Wash.

[21] Appl. No.: 09/006,696

[22] Filed: Jan. 14, 1998

Related U.S. Application Data

[63] Continuation-in-part of application No. 08/618,623, Mar. 19, 1996, abandoned.

[51] Int. Cl.⁶ ...................................................... H05K 5/06
[52] U.S. Cl. ............................................ 174/50.58; 174/51
[58] Field of Search ............................... 174/50.5, 50.58, 174/51

[56] References Cited

U.S. PATENT DOCUMENTS

| | | | |
|---|---|---|---|
| 4,628,283 | 12/1986 | Reynolds | 331/68 |
| 4,720,693 | 1/1988 | Tikes | 333/252 |
| 4,931,756 | 6/1990 | Doehler et al. | 333/252 |
| 4,967,315 | 10/1990 | Schelhorn | 174/51 X |
| 4,985,659 | 1/1991 | Tikes et al. | 333/252 |
| 5,001,299 | 3/1991 | Hingorany | 174/52.4 |
| 5,013,997 | 5/1991 | Reese | 323/212 |
| 5,109,594 | 5/1992 | Sharp et al. | 29/600 |
| 5,110,307 | 5/1992 | Rapoza | 439/566 |
| 5,223,672 | 6/1993 | Pinneo et al. | 174/52.4 |
| 5,298,683 | 3/1994 | Taylor | 174/152 GM |
| 5,430,257 | 7/1995 | Lau et al. | 174/151 |
| 5,675,122 | 10/1997 | Taylor | 174/50.58 |

*Primary Examiner*—Dean A. Reichard
*Attorney, Agent, or Firm*—Ann W. Speckman; Janet Sleath

[57] ABSTRACT

A microwave electronics package has a microwave waveguide window assembly hermetically sealed to the electronics package using an intermediate bimetallic bushing. The metallic components of the bimetallic bushing have thermal properties similar to the thermal properties of the housing and waveguide window frame, respectively, permitting the use of fusion welding techniques such as laser welding to hermetically seal the waveguide assembly in the housing and to preserve the integrity of the waveguide window during fusion welding and during thermal cycling of the electronics package. A microwave grounding element is also provided in the assembled electronics package to provide a continuous microwave ground path.

15 Claims, 3 Drawing Sheets

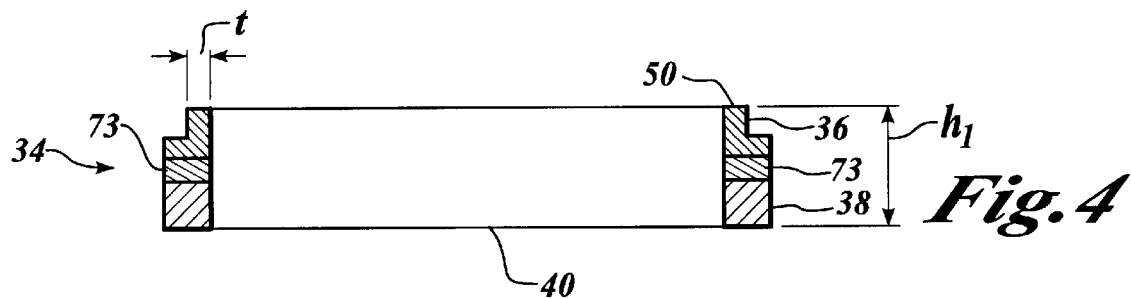
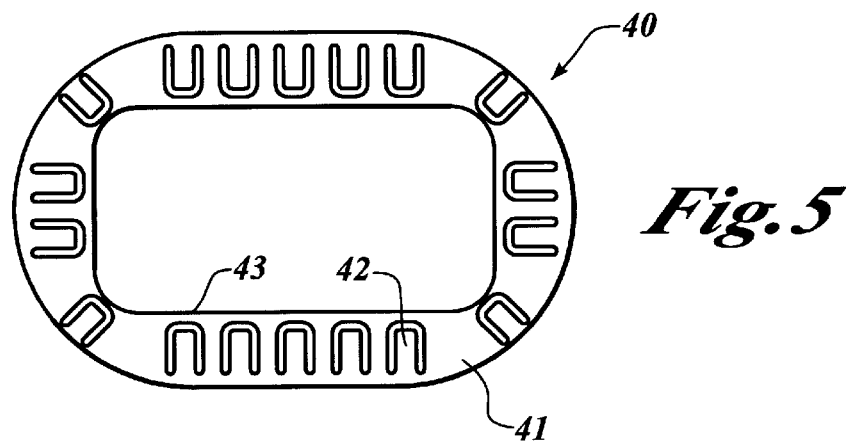
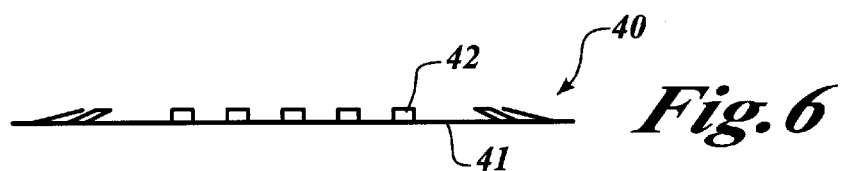
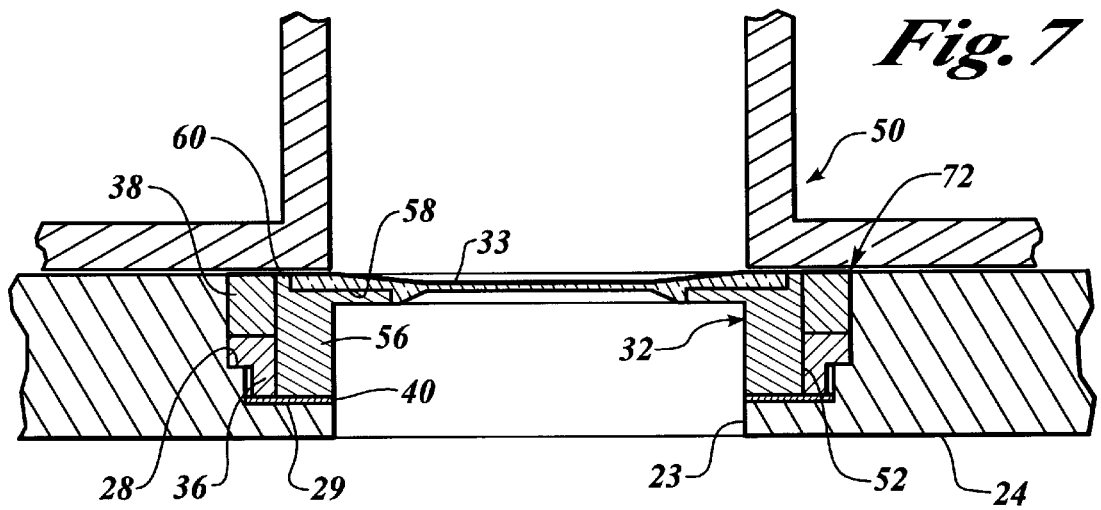

WAVEGUIDE WINDOW ASSEMBLY AND MICROWAVE ELECTRONICS PACKAGE

CROSS REFERENCE TO RELATED APPLICATION

This application is a continuation-in-part of prior U.S. patent application Ser. No. 08/618,623, filed Mar. 19, 1996, now abandoned.

FIELD OF THE INVENTION

This invention relates generally to an electronics package having a waveguide window that allows microwaves to pass between the interior and exterior of the electronics package.

BACKGROUND OF THE INVENTION

Microwave electronics packages are frequently produced from aluminum alloys since such alloys have low weight and good thermal dissipation. These packages are generally machined from thick aluminum or an aluminum alloy block to house a microwave source. The housing has at least one wall with a through-opening over which a transparent waveguide window is hermetically sealed to allow microwaves to pass between the interior and exterior of the housing. It is necessary to have a reliable hermetic seal between the metal window frame and the metal electronics package housing.

Compatible metals may be interfaced with each other using standard procedures, such as laser welding, soldering, and the like. Dissimilar metals, e.g., metals characterized by differing thermal expansion properties, melting points, weld incompatibilities and the like, do not reliably interface using such standard laser welding and soldering procedures. For example, iron cannot be physically laser welded to aluminum, and solder joints between iron and aluminum have a definite thermal fatigue cycle life. As a result, an iron-based metal waveguide window frame cannot be reliably soldered or laser welded to an aluminum electronics package and undergo sustained periods of reliable operation.

Currently, waveguide windows are mounted to electronics packages using complicated solder techniques. A glass window is sealed to a metal frame using a conventional glass-to-metal sealing technique. The metal frame is typically made of an iron-based alloy such as KOVAR®. The metal frame is designed to interface with the glass in a standard fashion. The glass window/metal frame sub-assembly is mounted and soldered to a copper bellows. The copper bellows is soldered to the aluminum electronics package. The copper bellows helps relieve the thermal stresses caused by the different thermal expansion properties of the metal frame and the aluminum housing. The joint between the window assembly and the package housing must remain hermetic throughout repeated thermal cycling to provide reliable operation.

The use of the above-mentioned copper bellows between the glass window/metal frame subassembly and the electronics package housing has a number of drawbacks. It is difficult to coordinate soldering the window-to-bellows and the bellows-to-housing at the same time. Additionally, the window assembly is mounted within a small recess in the package housing which forms an abutment face to which the copper bellows is soldered. Since the copper bellows must be sealed to the package housing within the recess, it is difficult to obtain an accurate and reliable solder joint within the recess. Furthermore, the temperature required to solder, which is typically about 200° C., often stresses the glass window and breaks it.

Soldering techniques typically produce a rather high heat affected zone (HAZ), which may extend into the glass-to-metal seal (GTMS) zone in waveguide assemblies. Use of joining techniques producing a large HAZ may adversely affect the integrity of the glass window, as well as the integrity of the connection between the glass window and the metal frame. To maintain the integrity of the GTMS zone, it is preferable to use joining techniques having a low or narrow HAZ. It is known that laser welding produces a relatively low HAZ. However, it is not possible to hermetically join metals having dissimilar thermal properties, such as copper or iron alloys with aluminum or an aluminum alloy.

Methods are known for interfacing dissimilar metals. For example, an aluminum body and a standard iron-based body may be joined through the use of a transition bushing. A transition bushing is a metal-to-metal interface bushing fabricated from a dissimilar metal sheet. A dissimilar metal sheet is a sheet of metal consisting of two or more layers of dissimilar metal which have been joined together by, for example, an explosive weld. An explosive weld connotes the metallurgical bond created at the point of impact when one metal is driven against another by the force of an explosion.

U.S. Pat. No. 5,001,299 discloses an explosively bonded electronics package having an aluminum housing with upper and lower layers of a dissimilar metal clad thereto. Holes are drilled in the side of the housing to accommodate sealed wires that are connected to a ceramic substrate attached to the floor of the housing.

U.S. Pat. No. 5,109,594 discloses a method of making a sealed transition joint for an electrical contact pin connection unit. In this device, the pin is sealed to the connector by a glass seal having a uniform shape. In order to increase reliability of the glass seal, it must be relatively thick. The transition joint is made of dissimilar metal layers where one layer is made of the same material as the package housing and the other layer is made of the same material as the pin connector.

U.S. Pat. No. 5,110,307 discloses a bi-metal flange providing a hermetic seal between a pin connector and an electronics package housing.

U.S. Pat. No. 5,298,683 discloses a connector formed from at least two dissimilar metals that is capable of sealing a hermetic feed-through in an electronics package.

These prior art devices do not disclose a waveguide window assembly having a metal window frame for mounting a thin glass window that is capable of being hermetically sealed to an electronics package, preferably by a laser weld, without adversely affecting the integrity of the sealed glass window.

U.S. Pat. No. 5,430,257 discloses a waveguide window assembly in which a buffer section, composed of materials which progressively vary the coefficient of thermal expansion, is mounted between the housing and the window frame. A preferred embodiment employs a buffer section composed of two materials arranged in side-by-side relationship, with a deep groove formed near the interface between the two materials to provide stress relief. Soldering is the preferred method for joining the window to the frame and the frame to the housing. High thermal stresses are generated, however, during soldering, which result in high breakage rates for the delicate transparent window. The assembly disclosed in this patent furthermore suffers performance problems as a consequence of discontinuities in the microwave ground path along the waveguide tube where it joins the waveguide window assembly.

The waveguide assembly of the present invention is thus capable of being hermetically sealed in an electronics package in such a way that installation of the waveguide window in the electronics package and repeated thermal cycling of the assembly do not result in any breakage or deterioration in the performance properties. The assembly of the present invention also provides for a continuous microwave signal ground path, thereby improving signal transmission and fidelity.

SUMMARY OF THE INVENTION

The present invention provides a waveguide window assembly that can be hermetically sealed in a microwave electronics package, preferably using laser welding techniques, and provides reliable microwave transmission between the electronics package interior and the exterior atmosphere.

The microwave package has a housing comprising a first material having a first coefficient of expansion such as aluminum or an aluminum alloy. The waveguide window frame supports a window that is transparent to microwave signals, such as a thin glass window made of 7070 Corning glass having a thickness of about 0.005–0.008 inches. The window frame is preferably constructed from a material having a second coefficient of thermal expansion, such as KOVAR®, that is compatible with the coefficient of thermal expansion of the glass window.

The window frame comprises a body with an outer periphery and first and second opposite faces. The frame body preferably has a hollow cavity formed by sidewalls on one face and a recess formed by a thin peripheral lip on the opposite face. An opening connects the cavity and the recess. The transparent window is mounted within the recess so that the periphery of the glass window is substantially adjacent the thin peripheral lip of the frame body. The sidewalls of the cavity on the first face preferably have a thickness substantially greater than that of the thin peripheral lip.

A bimetallic bushing is provided for hermetically connecting the waveguide window assembly to the housing. The bushing comprises first and second layers of material metallurgically bonded together and having first and second metallic compositions. The bushing is mounted over the window frame so that the second layer of material is substantially adjacent to the thick sidewalls of the frame and is welded thereto. The second layer of the bushing is hermetically sealed to the window frame, preferably by laser welding, and is made of a material that is metallurgically compatible with the material of the window frame. Suitable compatible materials include KOVAR® and iron-nickel alloys, such as alloy 42, 44 or 46. Due to the fragility of the glass, the second layer of the bimetallic bushing is preferably laser weldable to the window frame and has a coefficient of thermal expansion compatible with the coefficient of thermal expansion of the window frame. This matching of thermal properties minimizes the stress at the window frame joint and at the transparent glass window during thermal cycling. The laser weld is preferably done at ambient temperatures and has a small heat affected zone (HAZ). The second layer of the bimetallic bushing preferably has a reduced thickness portion adjacent the laser weld zone to facilitate a small mass weld zone. A small mass weld zone produces a narrow HAZ that does not adversely affect the integrity of the glass-to-metal-seal (GTMS) zone between the glass window and the metal window frame.

The first layer of the bimetallic bushing is hermetically sealable to the electronics package housing, preferably using laser welding techniques, and has thermal properties that are compatible with those of the housing. The first layer preferably comprises aluminum or an aluminum alloy, and is preferably laser welded at an interface between the first layer and the housing. The first layer of the bimetallic bushing is positioned adjacent the thin peripheral lip of the window frame and is welded to the housing at a location spaced from the glass window so that the HAZ does not affect the GTMS zone where the window is joined to the window frame. The window frame and the bimetallic bushing are configured and sized so that laser welding techniques can be performed without damaging the fragile glass or the GTMS zone.

The waveguide window assembly of the present invention preferably utilizes a microwave grounding element when it is installed in an electronics package. A metallic waveguide tube is generally mounted to the exterior of the electronics package and centered over the waveguide window assembly. The waveguide tube acts as a ground path for the microwave signal. A microwave grounding element is preferably mounted between the waveguide window/bimetallic bushing assembly and the electronics housing to provide a ground path for the microwave signal and to even out discontinuities in the ground path that may otherwise result from gaps formed between the waveguide assembly and the housing. According to a preferred embodiment, the microwave grounding element comprises a metallic spring element.

This invention also provides a method for hermetically sealing a waveguide window assembly in an electronics package. This method includes positioning a metallic window frame having a microwave transparent window mounted therein within a bimetallic bushing and fusion welding the window frame to a thermally compatible layer of the bushing, preferably using a laser welding technique. A microwave grounding element is then positioned between the window frame/bushing assembly and a recess of the electronics package housing adapted to receive the waveguide window/bushing assembly, and the bushing is fusion welded to the housing, preferably using a laser welding technique. This method provides a reliable hermetic seal between the waveguide window assembly and the electronics package housing without adversely affecting the integrity of the fragile glass waveguide window that is capable of maintaining hermeticity during repeated thermal cycling. This method also provides a microwave/electronics assembly providing a continuous ground path for the microwave signal.

BRIEF DESCRIPTION OF THE DRAWINGS

The accompanying drawings illustrate preferred embodiments of the invention according to the practical applications of the principals thereof:

FIG. 4 shows a cross-sectional view of the bimetallic bushing of the present invention.

FIG. 5 shows a top plan view of a microwave grounding element of the present invention in the form of a metallic spring.

FIG. 6 shows a side view of the microwave grounding element of FIG. 5.

FIG. 7 shows an enlarged, cross-sectional view of a waveguide window/bimetallic bushing assembly and a microwave grounding element mounted in an electronics package housing and illustrates placement of the external microwave tube.

DETAILED DESCRIPTION

Figure 1:
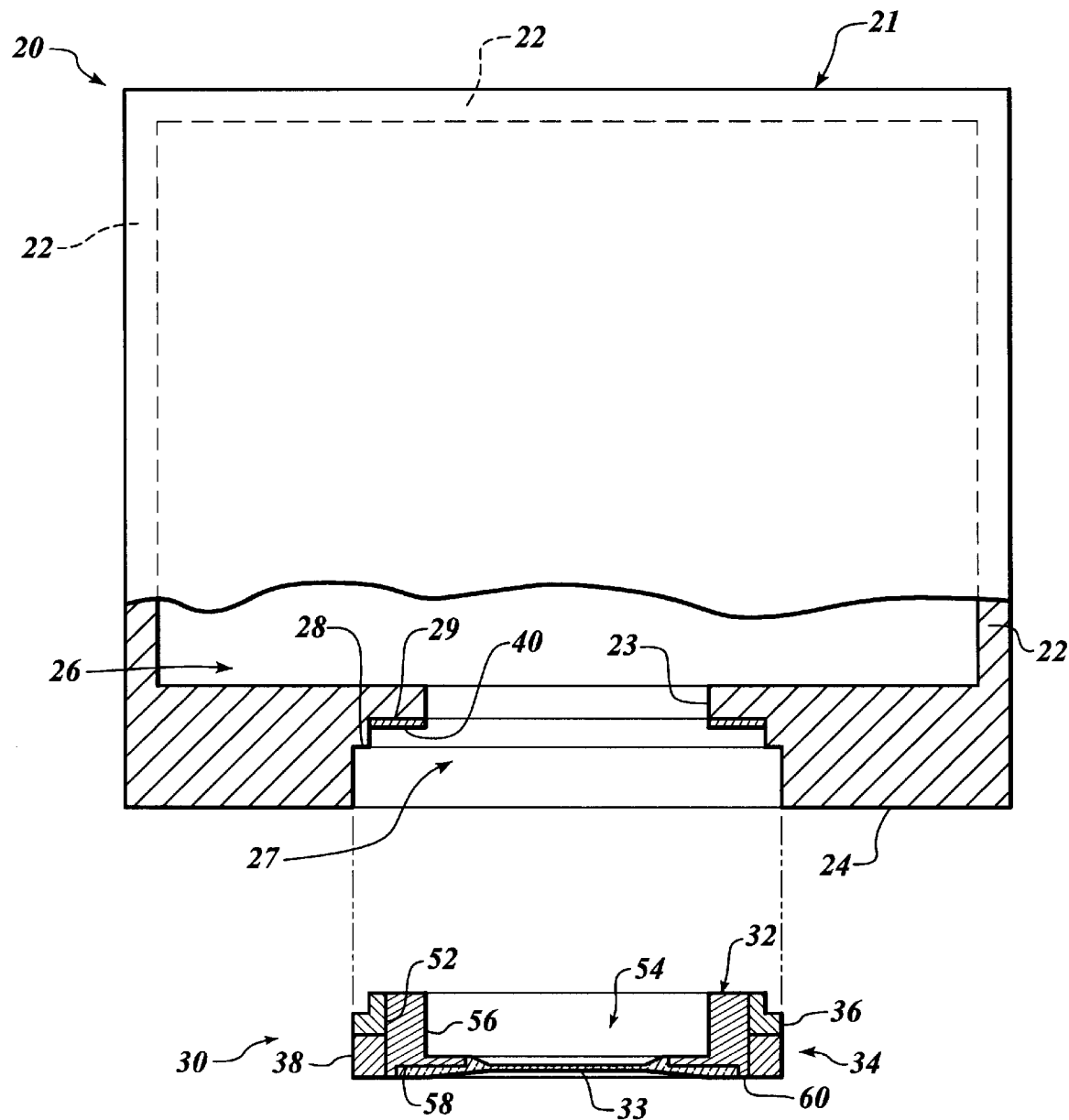
FIG. 1 shows a side elevation plan view of a preferred microwave electronics package and waveguide window assembly of this invention.

Referring now to FIG. 1, a microwave electronics module 20 is illustrated having a housing 21 preferably constructed from aluminum or an aluminum alloy. Electronics package housing 21 has sidewalls 22 and an end wall 24 which define an interior space 26 for receiving a microwave source (not shown). The end wall 24 has a through opening 27 for receiving a waveguide window/bimetallic bushing assembly 30. Assembly 30 comprises a microwave transparent window 33 mounted in a metallic window frame 32, which is hermetically sealed to a bimetallic bushing assembly 30 and, when sealed in housing 21, permits transmission of microwaves in and out of electronics housing 21, while maintaining a hermetic seal between the interior of the electronics housing and the ambient atmosphere. The electronics housing is preferably constructed from aluminum or an aluminum alloy.

FIG. 1 also illustrates a preferred configuration for through opening 27 in end wall 24 of housing 21. Through opening 27 preferably comprises shoulder 28 and abutment surface 29 corresponding to the configuration of waveguide window/bimetallic bushing assembly 30. A microwave grounding element 40 is positioned between abutment surface 29 of housing 21 and waveguide window/bimetallic bushing assembly 30 prior to hermetically sealing assembly 30 to housing 21 to provide a continuous microwave ground path.

Figure 2:
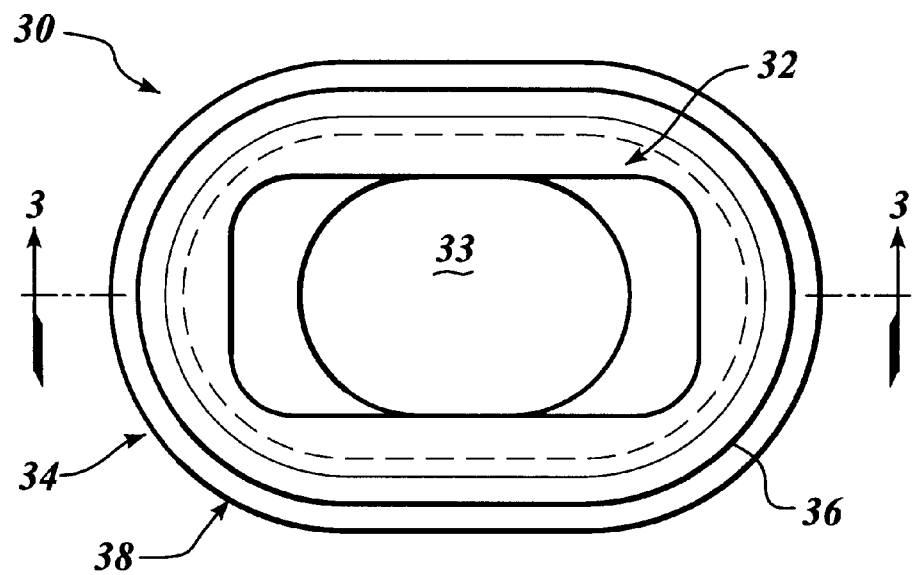
FIG. 2 shows a top plan view of a waveguide window assembly mounted in a bimetallic bushing.
Figure 3:
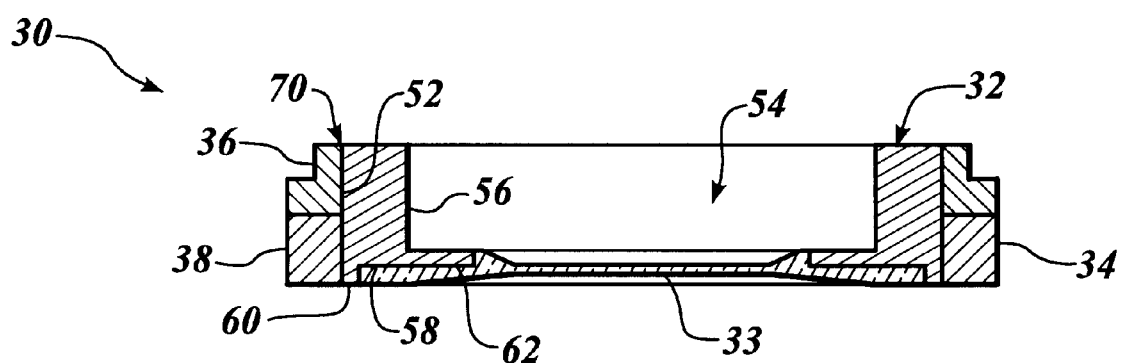
FIG. 3 shows a cross-sectional view of the waveguide window assembly and bimetallic bushing taken along line 3—3 of FIG. 2.

Referring now to FIGS. 2 and 3, assembly 30 comprises metallic window frame 32, microwave transparent window 33, and bimetallic bushing 34. The frame 32 is preferably constructed from an iron-based alloy that has a coefficient of thermal expansion compatible with the coefficient of thermal expansion of a glass window. Window frame 32 preferably comprises an alloy such as a FE-NI-CO alloy, such as KOVAR®, and is mounted within the bimetallic bushing 34. Microwave transparent window 33 is preferably constructed from glass, such as 7070 Corning glass, and is preferably about 0.005–0.008 inches thick. The window is sealed to metallic frame 32 using conventional glass-to-metal-sealing (GTMS) techniques to provide a hermetic seal between the window and the metallic frame. Metallic window frame 32 is designed to interface with the glass window 33 in a standard fashion.

Bimetallic bushing 34 comprises a first material layer 38 and second material layer 36 that are preferably metallurgically bonded together, such as by explosively bonding two metallic layers. A metallurgical bond between the two different layers 36, 38 of the bushing 34 is ideally the result of a cladding technique. One preferred technique is to provide a bimetallic composite material by metallurgically bonding an aluminum plate to a KOVAR® plate by means of an explosive charge. Such techniques are known as an explosive bonding or cladding and are described in U.S. Pat. Nos. 3,233,312; 3,397,444; and 3,493,353, which are incorporated herein by reference in their entireties. A variety of dissimilar and/or incompatible metals may be hermetically bonded in this manner without the constraints imposed by other bonding methods which require greater compatibility between the materials. The resulting bimetallic laminate exhibits a bonding zone which includes multi-component, interatomic mixtures of metals of the two dissimilar materials.

According to the present invention, the first material layer 38 of bimetallic bushing 34 comprises a metallic composition that is compatible with the metal of housing 21, preferably aluminum or an aluminum alloy. The word compatible, as used herein with respect to various metals, indicates the ability of a metal to hermetically seal to another metal to maintain a reliable hermetic seal during thermal cycling, and generally indicates metallic materials having similar thermal properties, especially similar coefficients of thermal expansion. When electronics housing 21 comprises aluminum or an aluminum alloy, first layer 38 of bimetallic bushing 34 preferably comprises aluminum alloy 4032, 4043 or 4047.

Due to the fragility of the glass window, the second layer 36 of bimetallic bushing 34 is preferably laser weldable to the window frame and comprises a material having a coefficient of thermal expansion that matches the coefficient of thermal expansion of the window frame ±2 PPM° C. This will minimize the stress in the glass over repeated thermal cycling of the assembly. The second layer of material 36 preferably comprises a metallic composition that is compatible with the metal of window frame 32. Since window frame 32 is preferably constructed from a FE-NI-CO alloy, such as KOVAR®, second layer 36 of bimetallic bushing 34 is preferably constructed from KOVAR® or an iron/nickel alloy such as alloy 42, 44 or 46.

Referring now to FIG. 4, it can be seen that the combined layers 36, 38 of the (bimetallic) bushing 34 have a depth $h_1$ corresponding to the depth of window frame 32. While first and second layers 38 and 36, respectively, of bimetallic bushing 34 are illustrated as being of generally equivalent depth, it will be recognized that one of the layers may have a greater mass or depth than the other layer. It will also be recognized that additional intermediate layers 73 may be provided in situations where a more gradual transition between different thermal properties is desired. According to a preferred embodiment, second layer 36 has a reduced thickness (t) rim 50 forming the interior surface of bimetallic bushing 34.

As seen in the figures, window frame member 32 has a body having an outer periphery 52 with a hollow cavity 54 formed by sidewalls 56. A shallow recess 58 is formed by a thin peripheral lip 60 and shoulder 62 for receiving window 33. The through opening formed by shoulder 62 provides communication between the cavity 54 and the exterior for passage of microwave signals. The glass window 33 is seated in recess 58 and is sealed to window frame 32 using conventional glass-to-metal sealing techniques.

To seal the waveguide window frame to bimetallic bushing 34, the inner surface of bushing 34 is positioned over the outer periphery 52 of window frame 32. The outer dimensions of window frame 32 correspond generally to the inner dimensions of bimetallic bushing 34 such that the window frame can slide within the bushing, yet there are no substantial gaps. The depth of bushing 34 substantially equals the depth of frame 32, so that the interior and exterior faces of bushing 34 are substantially flush with the interior and exterior faces of frame 32. Furthermore, bushing 34 is positioned over the window frame 32 so that the second layer 36 of bimetallic bushing 34 is adjacent the interior side of window frame 32 and the first layer 38 is adjacent peripheral lip 60 of frame 32 and window 33. Second layer 36 is then hermetically sealed to frame 32 at interface 70 between the reduced thickness rim 50 and sidewalls 56 of window frame 32. The reduced thickness rim 50 at the weld interface 70 allows for a small mass weld zone, which in turn produces a narrow HAZ that does not affect the previously sealed waveguide transparent window. Second layer 36 of bushing 34 is welded to frame 32, preferably using a fusion welding technique such as laser welding.

Once bimetallic bushing 34 and metal frame 32 have been welded together to form waveguide window/bimetallic bushing assembly 30, assembly 30 is ready to be mounted in end wall 24 of electronics package housing 21. As shown in FIG. 1, assembly 30 is positioned in opening 27 such that window 33 and first layer 38 of bimetallic bushing 34 are adjacent the exterior surface of base 24 and second layer 36 of bimetallic bushing 34 is located interiorly. End wall 24 of housing 21 preferably has a flange 23 providing an opening to the interior of housing 21 having dimensions corresponding to the dimensions of hollow cavity 54 of window frame 32. Opening 27 in end wall 24 of housing 21 preferably has a configuration and dimensions matching the configuration and dimensions of the outer periphery of bimetallic bushing 34, as shown. Therefore, when window/bimetallic bushing assembly 30 is mounted in opening 27 of end wall 24 of the housing, the exterior faces of the window assembly are flush with the exterior face of housing end wall 24 and there are no substantial gaps between assembly 30 and housing 21.

Microwave grounding element 40 is mounted between housing 21 and window/bimetallic bushing assembly 30 prior to installation of the window assembly in the electronics housing. FIG. 7 illustrates an enlarged cross-sectional view of a window/bimetallic bushing assembly 30 installed in an electronics package housing 21 with a microwave tube 50 mounted to the exterior of the housing at microwave window 33. Microwave signals travel through the interior of microwave tube 50 and are transmitted through microwave transparent window 33 between the interior and exterior of electronics package housing 21. Waveguide tube 50 furthermore acts as a ground path for the microwave signal. In this respect, maintenance of a continuous microwave ground path between the interior of electronics package housing 21 and microwave tube 50 is important to the performance of the microwave package.

Microwave grounding element 40 facilitates the maintenance of a continuous ground path between the package interior 26 and microwave tube 50. Grounding element 40 is constructed from a metallic material and is configured and sized to fit between the exterior face of flange 23 of end wall 24 and the interior surface of assembly 30 without interfering with the microwave transmission path. Grounding element 40 eliminates any gaps that might otherwise form between assembly 30 and housing 21.

According to a preferred embodiment illustrated in FIGS. 5 and 6, microwave grounding element 40 comprises a metallic element having a base 41 and a plurality of raised projections 42. The inner edge 43 of grounding element 40 is sized and configured to match the inner periphery of window frame 32 and flange 23. Grounding element 40 is preferably constructed from a metallic material, such as a beryllium-copper alloy, such that raised projections 42 are flexible and bendable. Flexing of raised projections 42 ensures that a continuous microwave ground path is maintained between assembly 30 and housing 21. According to an especially preferred embodiment, a thin sheet of metallic material, such as a beryllium-copper alloy, may be chemically etched using photoresist techniques to provide microwave grounding element 40.

As shown in FIG. 7, window frame 32 having window 33 hermetically sealed therein is hermetically sealed to bimetallic bushing 34 at interface 70 using a fusion welding technique such as laser welding. The microwave grounding element 40 is then placed on the facing surface of flange 23 of end wall 24 and the interior surface of assembly 30 is positioned adjacent and in physical contact with grounding element 40. First layer 38 of bimetallic bushing 34 is then hermetically sealed to end wall 24 at interface 72 using a fusion welding technique, preferably by laser welding. Microwave tube 50 may then be sealed to the exterior of end wall 24.

This invention has been described in detail with reference to a particular embodiment thereof, but it will be understood that various other modifications can be affected within the spirit and scope of this invention.

We claim:

1. A microwave electronics package comprising:
   a housing constructed from a first metallic material having an end wall with an opening;
   a waveguide window frame having a microwave transparent window member sealed thereto at a glass-to-metal seal zone, said frame being constructed from a second metallic material;
   a bushing having a first layer of metallic material and a second layer of metallic material, wherein the first layer of said bushing is metallurgically compatible with and positioned in proximity to the first material of said housing and the second layer of said bushing is metallurgically compatible with and positioned in proximity to the second material of said window frame, the window frame and the bushing forming a window frame/bushing assembly; and
   a microwave grounding element mounted between the window frame/bushing assembly and the housing.

2. A microwave electronics package of claim 1, wherein the waveguide window frame is fusion welded to the second layer of said bushing.

3. A microwave electronics package of claim 1, wherein the first layer of said bushing is fusion welded to said housing.

4. A microwave electronics package of claim 1, wherein the second layer of said bushing comprises an iron alloy.

5. A microwave electronics package of claim 1, wherein the first layer of said bushing comprises aluminum or an aluminum alloy.

6. A microwave electronics package of claim 1, wherein the microwave grounding element comprises a metallic spring element.

7. A microwave electronics package of claim 1, wherein the first and second layers of metallic material forming the bushing are metallurgically bonded to one another.

8. A microwave electronics package of claim 7, wherein the first and second layers of metallic material forming the bushing are explosively bonded to one another.

9. A microwave electronics package of claim 1, wherein the first and second layers of metallic material forming the bushing have unequal mass.

10. A microwave electronics package of claim 1, additionally comprising at least one intermediate layer of metallic material positioned between the first and second layers of metallic material.

11. A microwave electronics package of claim 1, wherein the microwave grounding element comprises a base having a plurality of flexible raised projections.

12. A microwave electronics package of claim 1, wherein the microwave grounding element comprises copper.

13. A method for hermetically sealing a waveguide window assembly in a recess in an electronics package, comprising:

positioning a metallic window frame having a microwave transparent window mounted therein in proximity to a bushing comprising at least a first and a second different metallic components;

fusion welding the window frame to the second metallic component of the bushing to form a window frame/bushing assembly;

positioning a microwave grounding element between the window frame/bushing assembly and the recess in the electronics package; and fusion welding the first metallic component of the bushing to the electronics package.

14. A method according to claim 13, additionally comprising laser welding the window frame to the second metallic component of the bushing.

15. A method according to claim 13, additionally comprising laser welding the first metallic component of the bushing to the electronics package.

\* \* \* \* \*